United States Patent
Tian et al.

(10) Patent No.: US 8,769,450 B1
(45) Date of Patent: Jul. 1, 2014

(54) SYNTHESIS FLOW FOR FORMAL VERIFICATION

(71) Applicant: Xilinx, Inc., San Jose, CA (US)

(72) Inventors: Bing Tian, San Jose, CA (US); Ashish Sirasao, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/931,621

(22) Filed: Jun. 28, 2013

(51) Int. Cl.
*G06F 9/45* (2006.01)

(52) U.S. Cl.
USPC .......................................................... 716/103

(58) Field of Classification Search
USPC .......................................................... 716/103
See application file for complete search history.

(56) References Cited

U.S. PATENT DOCUMENTS 5,465,216 A * 11/1995 Rotem et al. .................. 716/103
2009/0112547 A1 * 4/2009 Matsliah et al. ................ 703/13

* cited by examiner

*Primary Examiner* — Suresh Memula
(74) *Attorney, Agent, or Firm* — Kevin T. Cuenot

(57) ABSTRACT

Processing a circuit design includes generating a transformation output from a transformation input for each of a plurality of transformations of a synthesis flow applied to the circuit design. For each transformation, the transformation input and the transformation output represent the circuit design. At least one circuit element is changed from the transformation input to the transformation output. For each transformation, a hardware description language representation of the transformation input and a hardware description language representation of the transformation output are generated. For each transformation, determining whether the hardware description language representation of the transformation input is equivalent to the hardware description language representation of the transformation output.

20 Claims, 6 Drawing Sheets

SYNTHESIS FLOW FOR FORMAL VERIFICATION

FIELD OF THE INVENTION

This specification relates to integrated circuits (ICs) and, more particularly, to a synthesis flow that facilitates efficient formal verification.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

The process by which a circuit design is implemented within an IC, including a programmable IC, is referred to as "synthesis" or a "synthesis flow." One example of a synthesis flow begins with a circuit design specified as a collection of one or more hardware description language (HDL) files. The HDL files are processed through several different transformations that collectively form the synthesis flow culminating in a gate level netlist. The various circuit elements of the gate level netlist are correlated with actual circuit blocks or structures available on the particular IC in which the circuit design is to be implemented.

In order to ensure that the output generated by the synthesis flow is equivalent to the input provided, a formal verification process is performed. In general, the formal verification process compares the input to the synthesis flow with the output of the synthesis flow. Formal verification ensures that the output of the synthesis flow correctly implements the specification for the circuit design as does the input to the synthesis flow. Formal verification further can ensure that the input, which is typically specified in a high level or abstract form, is correctly translated into the lower level form. As such, formal verification ensures that the input to the synthesis flow is functionally equivalent to the output of the synthesis flow.

Formal verification, however, is a complex problem. The complexity arises, in large part, from the significant difference between the input to the synthesis flow and the resulting output. In most cases, formal verification is a time consuming process, but possible to perform. In other cases, however, formal verification and, more particularly, establishing equivalency between input and output of the synthesis flow, is not possible.

SUMMARY

A method of processing a circuit design includes generating, using a processor, a transformation output from a transformation input for each of a plurality of transformations of a synthesis flow applied to the circuit design. For each transformation, the transformation input and the transformation output represent the circuit design. At least one circuit element is changed from the transformation input to the transformation output. The method also includes, for each transformation, generating a hardware description language representation of the transformation input and a hardware description language representation of the transformation output. The method further includes, for each transformation, determining whether the hardware description language representation of the transformation input is equivalent to the hardware description language representation of the transformation output.

A system includes a processor coupled to a memory storing program code. The processor, upon executing the program code, is programmed to initiate executable operations. The executable operations include generating a transformation output from a transformation input for each of a plurality of transformations of a synthesis flow applied to the circuit design. For each transformation, the transformation input and the transformation output represent the circuit design. At least one circuit element is changed from the transformation input to the transformation output. The executable operations also include, for each transformation, generating a hardware description language representation of the transformation input and a hardware description language representation of the transformation output. The executable operations further include, for each transformation, determining whether the hardware description language representation of the transformation input is equivalent to the hardware description language representation of the transformation output.

A non-transitory computer-readable medium includes instructions which, when executed by a processor, perform a method. The method includes generating a transformation output from a transformation input for each of a plurality of transformations of a synthesis flow applied to the circuit design. For each transformation, the transformation input and the transformation output represent the circuit design. At least one circuit element is changed from the transformation input to the transformation output. The method also includes, for each transformation, generating a hardware description language representation of the transformation input and a hardware description language representation of the transformation output. The method further includes, for each transformation, determining whether the hardware description language representation of the transformation input is equivalent to the hardware description language representation of the transformation output.

DETAILED DESCRIPTION OF THE DRAWINGS

Figure 1:
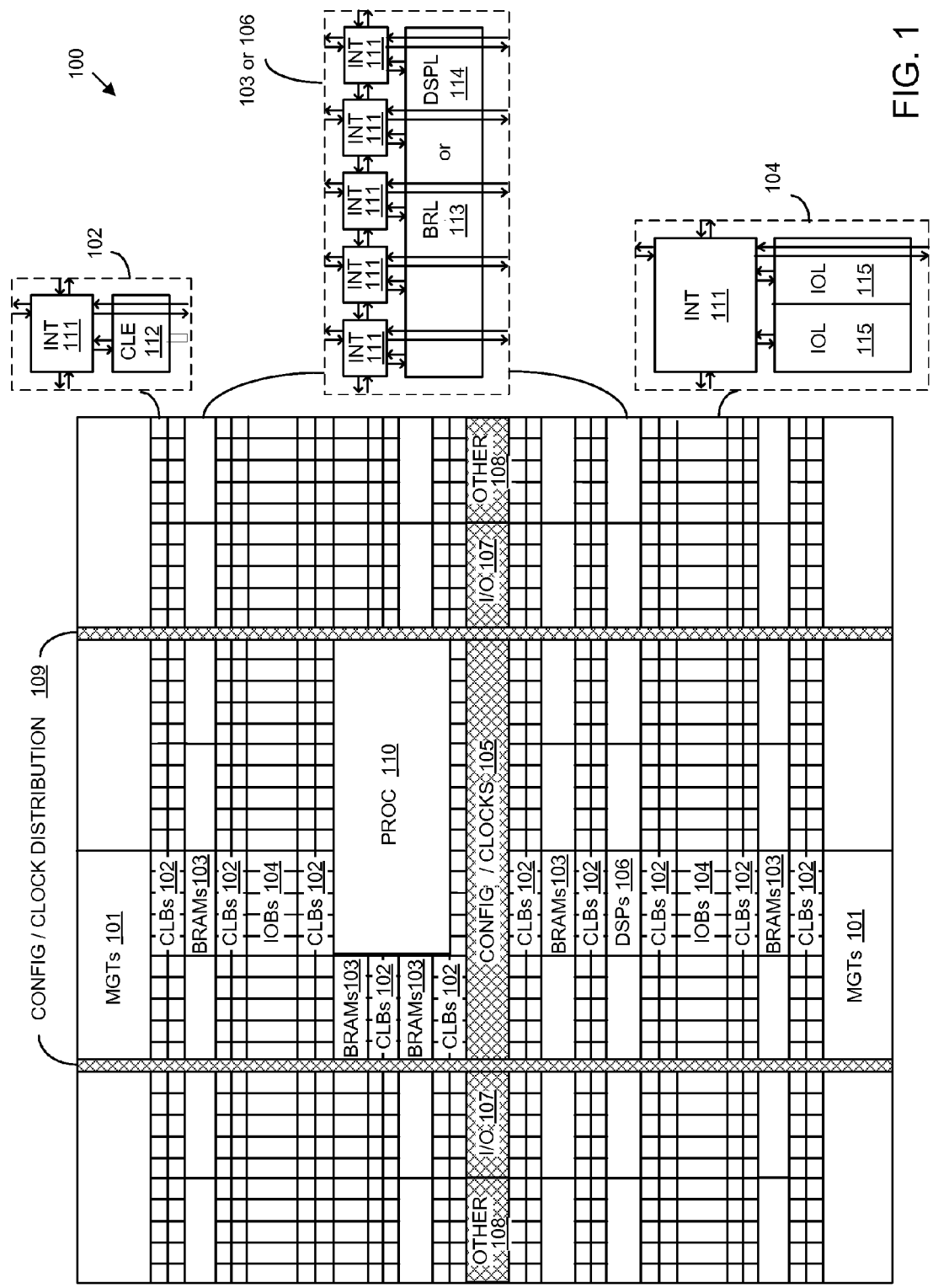
FIG. 1 is a block diagram illustrating an exemplary architecture for an integrated circuit (IC).

While the specification concludes with claims defining novel features, it is believed that the various features disclosed within this specification will be better understood from a consideration of the description in conjunction with the drawings. The process(es), machine(s), manufacture(s) and any variations thereof described within this specification are provided for purposes of illustration. Specific structural and functional details disclosed within this specification are not to be interpreted as limiting, but merely as a basis for the claims and as a representative basis for teaching one skilled in the art to variously employ the features described in virtually any appropriately detailed structure. Further, the terms and phrases used within this specification are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

This specification relates to integrated circuits (ICs) and, more particularly, to a synthesis flow that facilitates efficient, formal verification. In accordance with the inventive arrangements disclosed within this specification, a synthesis flow performed on a circuit design is subdivided into a plurality of different transformations. Each transformation of the synthesis flow is configured to receive an input and generate an output that is provided to the next transformation of the synthesis flow.

In one aspect, the input to each transformation and the output from each transformation is converted into a hardware description language (HDL) representation. A formal verification process then can be performed on a per-transformation basis using the HDL representations. The HDL representation of an input to a transformation, for example, is compared with the HDL representation of the output from the same transformation for purposes of formal verification.

By breaking the formal verification process into a plurality of smaller formal verification processes, or sub-processes as the case may be, the overall formal verification process can be performed with greater speed than performing formal verification as a single, monolithic process. Further, verification can be performed with greater certainty of completion to prove equivalency.

An HDL refers to a computer-language that facilitates the documentation, design, and manufacturing of a digital system, such as an integrated circuit. An HDL combines program verification techniques with expert system design methodologies. Using an HDL, for example, a user can design and specify an electronic circuit, describe the operation of the circuit, and create tests to verify operation of the circuit. In general, an HDL includes standard, text-based expressions of the spatial and temporal structure and behavior of the electronic system being modeled. HDL syntax and semantics include explicit notations for expressing concurrency. In contrast to most software programming languages, an HDL also includes an explicit notion of time, which is a primary attribute of a digital system.

FIG. 1 is a block diagram illustrating an exemplary architecture 100 for an IC. In one aspect, architecture 100 is implemented within a programmable IC. For example, architecture 100 can be implemented within a field programmable gate array (FPGA) type of IC. As shown, architecture 100 includes several different types of programmable circuit, e.g., logic, blocks. For example, architecture 100 can include a large number of different programmable tiles including multi-gigabit transceivers (MGTs) 101, configurable logic blocks (CLBs) 102, random access memory (RAM) blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. As pictured in FIG. 1, a BRAM tile has the same height as five CLBs, but other numbers (e.g., four) also can be used. A DSP tile 106 can include a DSP logic element (DSPL) 114 in addition to an appropriate number of INTs 111. An IOB 104 can include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a shaded area or row near the center of the die, e.g., formed of regions 105, 107, and 108, can be used for configuration, clock, and other control logic. Shaded areas 109 extending from this row are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks can be programmable blocks and/or dedicated circuitry. For example, a processor block depicted as PROC 110 spans several columns of CLBs and BRAMs.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100 and replaced with one or more of the other varieties of the programmable blocks described. Further, such blocks can be utilized to form a "soft processor" in that the various blocks of programmable circuitry can be used to form a processor that can execute program code as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 103 and BRAMs 103 can be considered programmable circuitry of the IC.

In general, the functionality of programmable circuitry is not established until configuration data is loaded into the IC. A set of configuration bits can be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC. PROC 110 is an example of a hardwired circuit block.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 110 within the IC are for purposes of illustration only and are not intended as a limitation.

Figure 2:
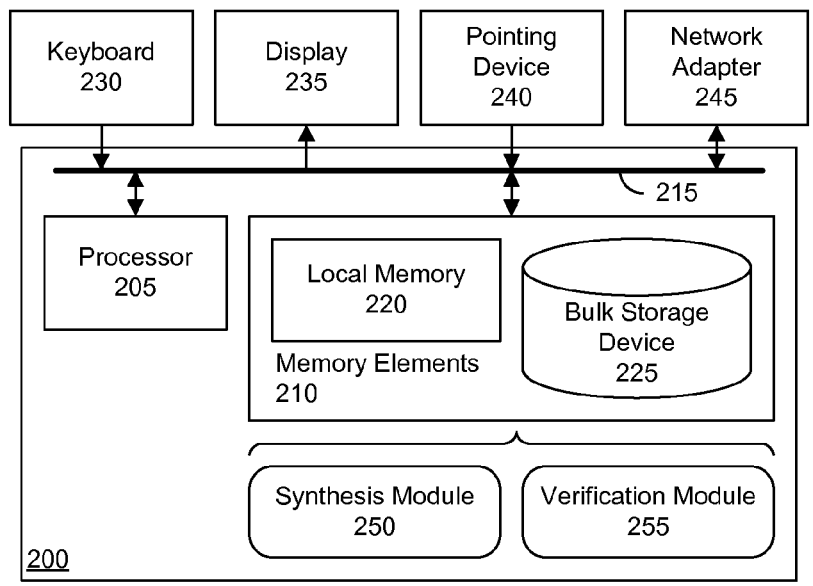
FIG. 2 is a block diagram illustrating an exemplary data processing system.

FIG. 2 is a block diagram illustrating an exemplary data processing system (system) 200. System 200 is configured to process a circuit design through a synthesis flow as described within this specification. As pictured, system 200 includes at least one processor 205, e.g., a central processing unit (CPU), coupled to memory elements 210 through a system bus 215 or other suitable circuitry. System 200 stores program code within memory elements 210. Processor 205 executes the program code accessed from memory elements 210 via system bus 215. In one aspect, system 200 is implemented as a computer that is suitable for storing and/or executing program code. It should be appreciated, however, that system 200 can be implemented in the form of any system including a processor and memory that is capable of performing the functions described within this specification.

Memory elements 210 include one or more physical memory devices such as, for example, a local memory 220 and one or more bulk storage devices 225. Local memory 220 refers to RAM or other non-persistent memory device(s) generally used during actual execution of the program code. Bulk storage device 225 can be implemented as a hard disk drive (HDD), a solid state drive (SSD), or another persistent data storage device. System 200 also can include one or more cache memories (not shown) that provide temporary storage of at least some program code in order to reduce the number of times program code must be retrieved from bulk storage device 225 during execution.

Input/output (I/O) devices such as a keyboard 230, a display 235, and a pointing device 240 optionally can be coupled to system 200. The I/O devices can be coupled to system 200 either directly or through intervening I/O controllers. A network adapter 245 also can be coupled to system 200 to enable system 200 to become coupled to other systems, computer systems, remote printers, and/or remote storage devices through intervening private or public networks. Modems, cable modems, Ethernet cards, and wireless transceivers are examples of different types of network adapter 245 that can be used with system 200.

As pictured in FIG. 2, memory elements 210 can store a synthesis module 250 and a verification module 255. Synthesis module 250 and verification module 255, being implemented in the form of executable program code, are executed by system 200. As such, both synthesis module 250 and verification module 255 are considered an integrated part of system 200.

Synthesis module 250, when executed by processor 205, causes system 200 to perform a synthesis flow upon a circuit design. Verification module 255, when executed by processor 205, causes system 200 to perform a verification process upon the input and the output of each of a plurality of different transformations of the synthesis flow implemented through execution of synthesis module 250. It should be appreciated that synthesis module 250, verification module 255, any circuit design, design parameters, inputs, and/or outputs utilized, or generated, by either synthesis module 250 or verification module 255, regardless of programmatic form, are functional data structures that impart functionality when employed as part of system 200 or when loaded into an IC such as a programmable IC.

While synthesis module 250 and verification module 255 are illustrated as two independent modules, it should be appreciated that the two modules can be combined and implemented as a single larger module. In another aspect, synthesis module 250 can be implemented as a collection of two or more modules responsible for performing the various transformations of a synthesis flow to be described herein in greater detail. Similarly, verification module 255 can be implemented as a collection of two or more modules configured to perform the various verification operations on a per-transformation basis as described herein.

Figure 3:
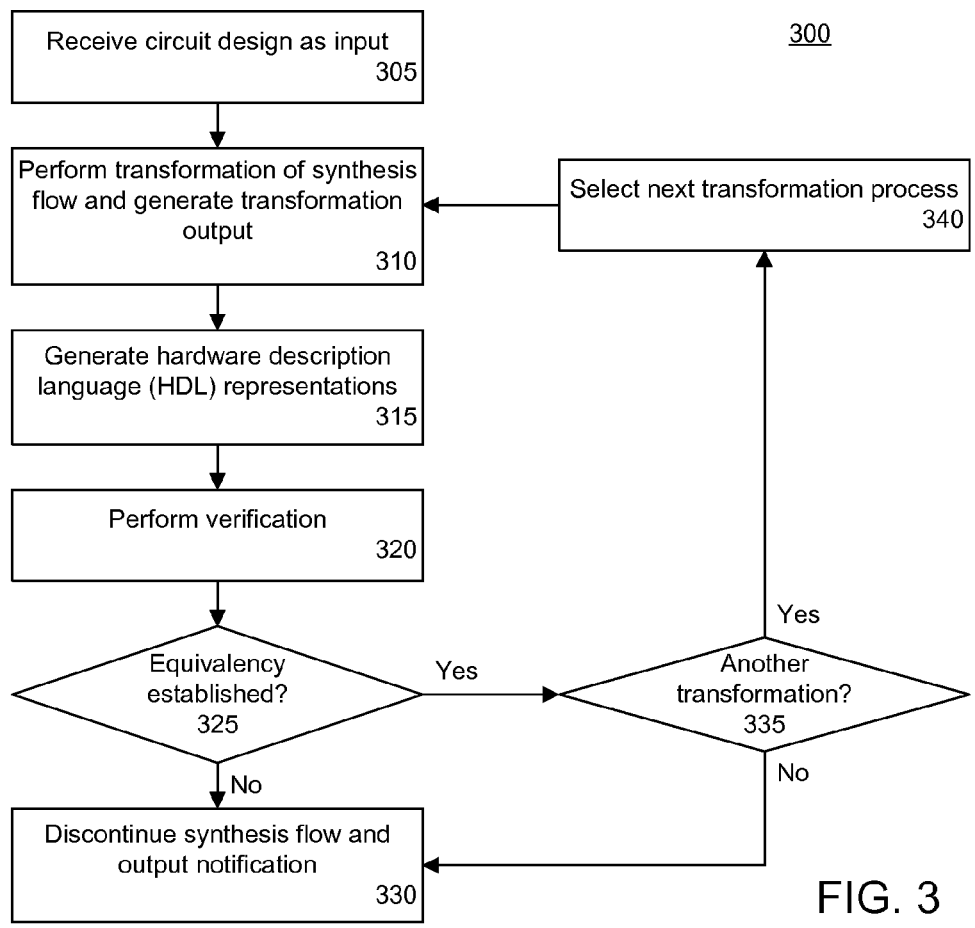
FIG. 3 is a flow chart illustrating an exemplary method of processing a circuit design.

FIG. 3 is a flow chart illustrating an exemplary method 300 of processing a circuit design. More particularly, method 300 illustrates a technique for performing a synthesis flow in which verification is performed multiple times throughout the synthesis flow. A verification, for example, can be performed for each transformation of the synthesis flow. Method 300 is performed by a system as described with reference to FIG. 2. Further, the circuit design processed may be processed for implementation within an IC having an architecture described with reference to FIG. 1 or another suitable architecture.

In block 305, the system receives a circuit design as an input. The circuit design, at least initially, can be specified as one or more HDL files. Examples of HDL files include, but are not limited to, Verilog and VHDL files. In block 310, the system performs a transformation of the synthesis flow upon the circuit design. More particularly, during the first iteration of method 300, the system operates upon the received input specifying the circuit design. In subsequent iterations, the system operates upon the transformation output generated by the transformation immediately prior to the transformation to be performed.

In performing block 310, the system generates a transformation output as a result. The transformation output includes mapping data. The mapping data specifies a correlation between circuit elements specified in the transformation input and the circuit elements specified in the transformation output. For purposes of clarity, circuit elements of a transformation input are referred to as input circuit elements. Circuit elements of a transformation output are referred to as output circuit elements. Rather than generating mapping data that is included within an additional or separate file, the mapping data is included directly within, or as part of, the transformation output. In one aspect, the mapping data is specified using a circuit element naming convention to be described in greater detail within this specification.

In block 315, the system generates HDL representations of the transformation input and/or the transformation output for the transformation performed in block 310 as needed. The HDL representation of the transformation input and the HDL representation of the transformation output of a given transformation are used for purposes of verification. It should be appreciated that when the transformation input is specified in HDL format, e.g., in the case of the first transformation of the synthesis flow, the system need not generate an HDL representation.

In block 320, the system performs verification. The system performs verification using the HDL representations generated in block 315. More particularly, the system performs verification using the HDL representation of the transformation input, e.g., the HDL representation of the input to block 310, and the HDL representation of the transformation output from block 310. While one or more circuit elements may change by application of a transformation of a synthesis flow, the transformation input and the transformation output each is a representation of the circuit design and, as such, should be functionally equivalent to one another.

In one aspect, the system compares the HDL representation of the transformation input with the HDL representation of the transformation output to prove equivalency. The system can perform verification using the mapping data contained in the transformation output. The mapping data allows the system to correlate output circuit elements with the particular input circuit elements from which the output circuit elements were generated or otherwise derived.

In block 325, the system determines whether equivalency has been established by the verification performed in block 320. If equivalency is established by verification, method 300 continues to block 335. If not, method 300 proceeds to block 330. Continuing with block 330, the system discontinues the synthesis flow. Further, the system generates and/or outputs a notification of the verification failure. The notification indicates the particular point at which the synthesis flow was discontinued, e.g., the particular transformation that generated an output that was not determined to be equivalent to the input. For example, the notification can indicate the particular transformation that was performed and for which equivalency was not established. Any further details relating to the verification in terms of which output circuit elements could not be correlated or verified against input circuit elements also can be specified.

In block 335, the system determines whether any further transformations are to be performed for the synthesis flow. If so, method 300 proceeds to block 340. If not, method 300 loops back to block 330. In block 330, the system discontinues the synthesis flow and outputs a notification. In this case, however, when the synthesis flow has completed, the notification can indicate a successful completion as opposed to indicating an error condition or failed verification.

In block 340, the system selects the next transformation to be performed in the synthesis flow. After block 340, method 300 loops back to block 310 to implement the next transformation and continue the synthesis flow and verification described.

Method 300 illustrates a technique in which verification is performed on a per transformation basis. By breaking verification into a plurality of smaller processes, the changes to the circuit design, e.g., the difference between a transformation input and a transformation output, can be more easily and accurately compared. Further, since the synthesis flow can be discontinued immediately after the transformation for which verification fails, circuit designers can be informed of the particular location in the synthesis flow that caused the verification failure. As such, the circuit designer is better able to update the circuit design or determine the source of the error.

Figure 4:
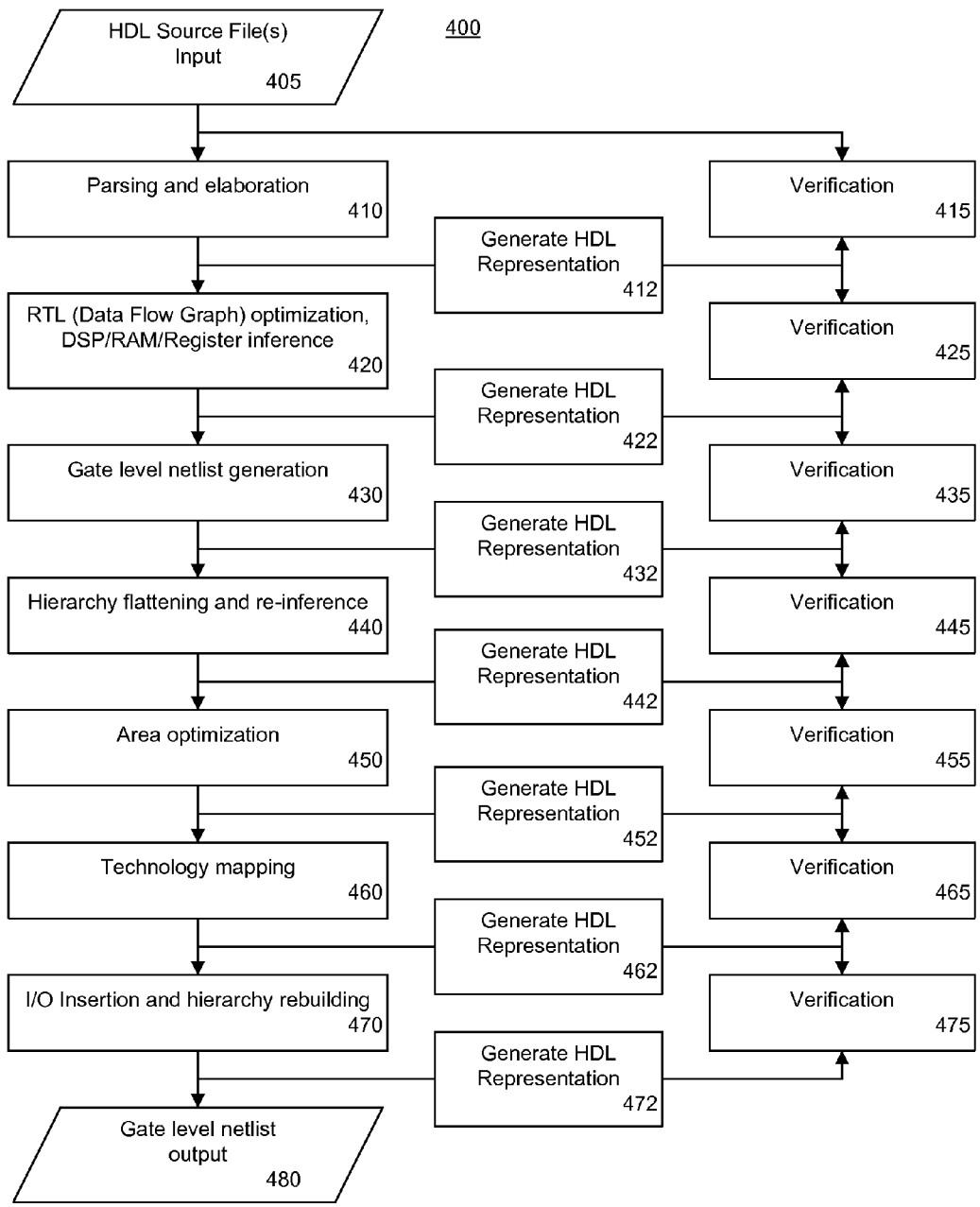
FIG. 4 is a block flow diagram illustrating another exemplary method of processing a circuit design.

FIG. 4 is a block flow diagram illustrating another exemplary method 400 of processing a circuit design. Method 400 illustrates a more detailed implementation of the technique described in FIG. 3. Accordingly, method 400 is performed by a system as described with reference to FIG. 2. Further, the circuit design that is processed through the synthesis flow may be processed for implementation within an IC having an architecture described with reference to FIG. 1 or another suitable architecture.

Method 400 begins in a state where HDL source files 405 are provided specifying a circuit design. In block 410, the system performs a transformation on the circuit design referred to as parsing and elaboration. HDL source files 405 are the transformation input provided to block 410. Parsing and elaboration is a process in which the system checks whether HDL source files 405 include correct HDL. In performing parsing and elaboration in block 410, the system may report any syntax errors detected within HDL source files 405.

Further, as part of elaboration, the circuit design is translated into a register-transfer level (RTL) representation. The RLT representation is a data flow graph that it generated as the transformation output from block 410. Within the data flow graph, each node represents a logic function or a sequential element. As noted, any mapping data generated during implementation of block 410 is inserted within the transformation output that is generated by block 410. For example, names of sequential elements such as registers, RAMs that are declared in HDL are used for the data flow graph objects that represent the sequential elements. Regarding RAMs, the width and depth, referred to as the "dimension" of the RAM, is transferred to, and specified by, the representative data flow graph object.

In block 412, the system generates an HDL representation of the transformation output generated by block 410. As noted, the transformation output of block 410 is a data flow graph. In general, the system generates HDL representations of transformation inputs and transformation outputs, as the case may be, for purposes of verification on a per transformation basis. Apart from verification, HDL representations of transformation inputs and/or transformation outputs are not necessary for purposes of the synthesis flow itself.

In block 415, the system performs verification on the circuit design. Block 415 compares the transformation input to block 410 with the transformation output from block 410. More particularly, in block 415 the system compares HDL files 405 with the HDL representation of the transformation output generated by block 412. Block 415 performs the comparison to prove equivalence between the HDL representations being compared.

In block 420, the system performs a next transformation referred to as RTL optimization and DSP/RAM/Register inference. The transformation input to block 420 is the transformation output from block 410. Within block 420, the system evaluates the data flow graph and identifies combinations of nodes and/or branches within the data flow graph that indicate a DSP circuit element, a RAM circuit element, or a register circuit element. The data flow graph is updated to include the mapping data specifying which nodes and/or branches correspond to the aforementioned circuit elements. The result from block 420 is a transformation output and is specified as a data flow graph.

Regarding block 420, in some cases the system replicates one or more registers. Replicated registers generally use the same or similar name as the register that is replicated, but add a "_rep" suffix. When the system infers a RAM, the name and dimension discussed in block 410 are not changed.

In general, there are two RAM determination, or inference, cases. The first case is where the system determines that one or more nodes correlate to a RAM without a register and the RAM is put into a partition. The second case is where the RAM is determined to include a register and both the RAM and the register are grouped to form a partition.

Referring to the second case, consider an example in which the data flow graph specifies a RAM "R" having an output that drives a register "O" Both R and O are grouped into a same partition. The partition is a hierarchical level created within the circuit design by the system to facilitate further synthesis flow transformations such as, for example, block 430, and facilitates mapping of the data flow objects to vendor specific library cells. The data flow objects in a given partition are mapped to one or more vendor specific library cells. Data flow objects of different partitions, for example, are not mapped to a same library cell.

In block 422, the system generates an HDL representation of the transformation output generated by block 420. As noted, the transformation output of block 420 is a data flow graph. For each of blocks 410 and 420 that output a data flow graph representation of the circuit design, a high level abstraction is used. The data flow graph output from each of blocks 410 and 420 is a word level RTL representation of the circuit design.

Each node or object of the data flow graph is represented as a model specifying an input to output logic relationship. By using models, the resulting HDL representation of the transformation output can be expressed in a simplified manner. For example, when writing out a node that represents a sum of two inputs A and B of a data flow graph within an HDL file, the system can write the expression "S=A+B" in HDL such as Verilog or the like. Using such a high level abstraction results in improved representation of the circuit design and simplifies verification.

In block 425, the system performs verification on the circuit design. Block 425 compares the transformation input to block 420 with the transformation output from block 420. More particularly, in block 425 the system compares the HDL representation of the transformation output generated by block 412 with the HDL representation of the transformation output generated by block 422. Block 425 performs the comparison to prove equivalence between the HDL representations being compared.

In block 430, the system performs a next transformation referred to as gate level netlist generation. Whereas the transformation output from each of blocks 410 and 420 was specified as a data flow graph, the transformation output from each of blocks 430, 440, 450, 460, and 470 is specified as a gate level netlist of one form or another. Accordingly, block 430 takes the transformation output from block 420 in the form of a data flow graph and generates a transformation output specified as a gate level netlist representation of the circuit design.

Figure 9:
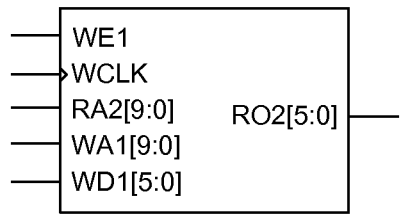
FIG. 9 is a block diagram illustrating an exemplary RTL implementation of a circuit.
Figure 10:
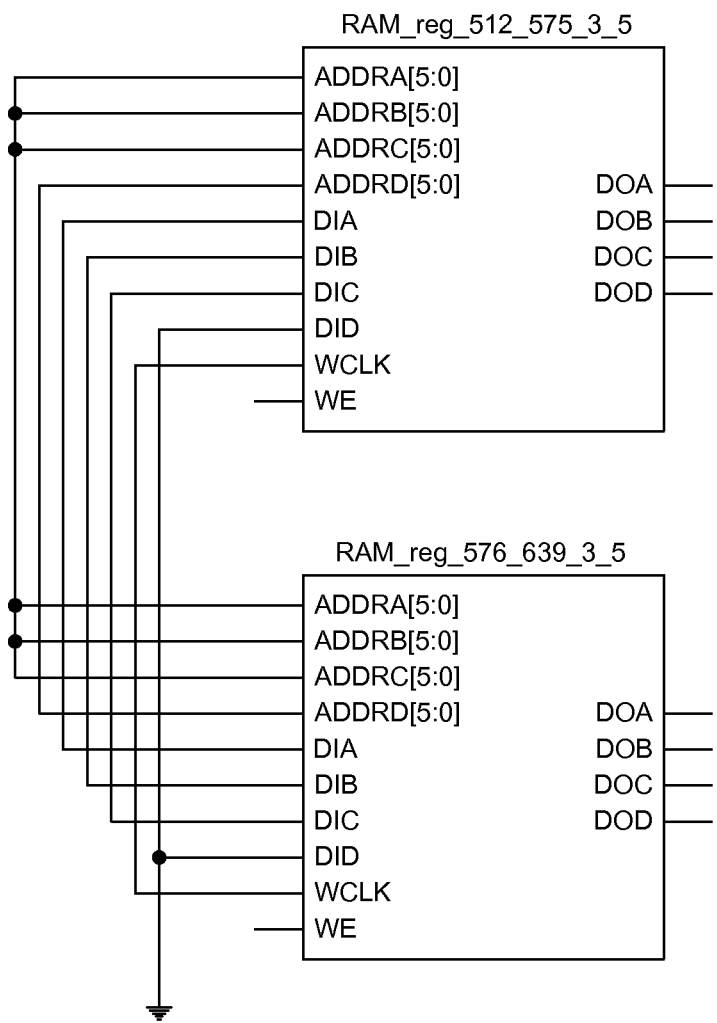
FIG. 10 is a block diagram illustrating an example of a technology mapped version of the circuit of FIG. 9.

A gate level netlist refers to a representation of a circuit design in terms of connected generic gates such as AND, OR, XOR, MUX (e.g., 2 to 1) type gates and various vendor-specific library cells for other circuit elements such as registers, RAMs, DSPs, etc. as required. For example, groups of data flow graph objects from partitions, e.g., a same partition, are mapped to vendor-specific library cells. In the case of RAMs, each RAM partition is mapped into one or more vendor-specific RAM cells. FIGS. 9 and 10 illustrate an example of such a mapping.

In the case of DSPs, each DSP partition is mapped to one or more vendor-specific DSP cells. When a DSP partition includes multiple registers, the vendor-specific DSP cells are named after the last register in the direction from the output to the input of the DSP. All other register names are dropped. This naming convention is implicitly understood by the verification process for purposes of comparison of two different HDL representations of the circuit design.

In block 432, the system generates an HDL representation of the transformation output generated by block 430. As noted, the transformation output of each of blocks 430, 440, 450, 460, 470, and 480 is a gate level netlist. The gate level netlist can be mapped, for example, to vendor-specific cells. Thus, the HDL representation of the transformation output from any of blocks 430, 440, 450, 460, 470, or 480, e.g., in Verilog, is specified as connected cell instances.

Referring to the prior example of the model "S=A+B" for the HDL representation of a transformation output described with reference to blocks 410 and/or 420, the HDL representation of the gate level netlist would specify library cell instances such as "S[0]=A[0]^B[0]" or "C[0]=A[0]&B[0]." Other examples of HDL representations of gate level netlists include "S[1]=A[1]^B[1]^C[0]," "C[1]=(A[1]&B[1])|(A[1]&C[0])|(C[0]&B[1])," "S[2]=A[2]^B[2]^C[1]," or the like.

In block 435, the system performs verification on the circuit design. Block 435 compares the transformation input to block 430 with the transformation output from block 430. More particularly, in block 435 the system compares the HDL representation of the transformation output generated by block 422 with the HDL representation of the transformation output generated by block 432. Block 435 performs the comparison to prove equivalence between the HDL representations being compared.

In block 440, the system performs a next transformation referred to as hierarchy flattening and re-inference. The transformation input to block 440 is the transformation output from block 430. In block 440, the system removes hierarchical module boundaries from the circuit design resulting in a flattened, or non-hierarchical, representation of the circuit design. Flattening the circuit design allows cross-module optimizations to be performed. Accordingly, block 440 generates a transformation output that is a flattened, gate level representation of the circuit design.

For example, to facilitate optimization of the circuit design, design hierarchies are flattened. In illustration, consider the case where the transformation input to block 440 contains an instance "a_inst" of a module "A," and there is a register "b" in module A. The transformation output of block 440 does not include "a_inst." Rather, the transformation output has a register named "a_inst/b."

In block 442, the system generates an HDL representation of the transformation output generated by block 440. In block 445, the system performs verification on the circuit design. Block 445 compares the transformation input to block 440 with the transformation output from block 440. More particularly, in block 445 the system compares the HDL representation of the transformation output generated by block 432 with the HDL representation of the transformation output generated by block 442. Block 445 performs the comparison to prove equivalence between the HDL representations being compared.

In block 450, the system performs a next transformation referred to as area optimization. The transformation input to block 450 is the transformation output from block 440. In block 450, the system performs area optimization. In illustration, consider the case in which the system determines that a register always remains constant. In that case, the system can remove the register from the netlist. This type of optimization is understood by the verification process and no information need be explicitly indicated in the HDL representations that are compared. In any case, the area optimization can be performed across module boundaries as the circuit design has been flattened in block 440. Accordingly, block 450 generates an area optimized transformation output that is a gate level representation of the circuit design.

In block 452, the system generates an HDL representation of the transformation output generated by block 450. In block 455, the system performs verification on the circuit design. Block 455 compares the transformation input to block 450 with the transformation output from block 450. More particularly, in block 455 the system compares the HDL representation of the transformation output generated by block 442 with the HDL representation of the transformation output generated by block 452. Block 455 performs the comparison to prove equivalence between the HDL representations being compared.

In block 460, the system performs a next transformation referred to as technology mapping. The transformation input to block 460 is the transformation output from block 450. In block 460, the system maps, or correlates, circuit elements, e.g., gates, with actual programmable blocks of the target IC. For example, block 460 maps logic gates to LUTs and/or vendor-specific library cells. Further, circuit elements in the transformation input are mapped to CLBs, BRAMs, DSPs, etc., of the actual target IC in which the circuit design is to be implemented. Block 460 further performs shift register mapping as illustrated in exemplary FIGS. 5-8. The mapping data, again, is inserted into the transformation output generated by block 460. Accordingly, block 460 generates a transformation output that is a technology mapped, gate level representation of the circuit design.

In block 462, the system generates an HDL representation of the transformation output generated by block 460. In block 465, the system performs verification on the circuit design. Block 465 compares the transformation input to block 460 with the transformation output from block 460. More particularly, in block 465 the system compares the HDL representation of the transformation output generated by block 452 with the HDL representation of the transformation output generated by block 462. Block 465 performs the comparison to prove equivalence between the HDL representations being compared.

In block 470, the system performs a next transformation referred to as I/O insertion and hierarchy rebuilding. The transformation input to block 470 is the transformation output from block 460. In block 470, the system inserts I/O circuit elements corresponding to actual I/Os of the target device for signals that are designated as I/Os of the circuit design. Further, in block 470 the system re-creates design hierarchies, also referred to as "modules," based upon the names of the instances.

In illustration, if there is a register named "a_inst/b" in the transformation input, block 470 generates a transformation output in which a new instance "a_inst" is created corresponding to module "A." Further, within module A, block 470 creates a register named "b." Accordingly, block 470 generates a transformation output that is a gate level representation of the circuit design, with I/Os, specified and re-created hierarch(ies). The transformation output from block 470 is illustrated in FIG. 4 as gate level netlist output 480.

In block 472, the system generates an HDL representation gate level netlist output 480. In block 475, the system performs verification on the circuit design. Block 475 compares the transformation input to block 470 with the transformation output from block 470. More particularly, in block 475 the system compares the HDL representation of the transformation output generated by block 462 with the HDL representation of the transformation output generated by block 472. Block 475 performs the comparison to prove equivalence between the HDL representations being compared.

When writing an HDL output file or files for each gate level representation of the circuit design as output from each of blocks 430, 440, 450, 460, and 470, a structured HDL file is written. Further, a gate level primitive library is provided or otherwise made available for the functions performed by the gate level primitives for purposes of verification.

While FIGS. 3 and 4 illustrate implementations where verification is performed subsequent to each transformation, in another aspect, verification can be performed after the synthesis flow has completed. In that case, though verification is performed following the synthesis flow, the various verification operations can be performed individually using a pairwise comparison in which the HDL representation of a transformation input of a transformation is compared with the HDL representation of the transformation output of the same transformation. Accordingly, the HDL files can be formally verified in this pairwise manner with each transformation output being compared only to the transformation output of the prior transformation. As a result, verification complexity is significantly reduced.

In the conventional case, transformations such as register replication, register removal, RAM mapping, shift register mapping, and DSP (multiplier decomposition, absorbing registers) mapping all take place so that the initial HDL circuit design is compared against the final, technology mapped netlist. The transformations noted are combined together and left for the verification module to sort out. By dividing the synthesis flow as described and making the output from each transformation available for verification, the verification module is provided with incremental transformations of the circuit design that may be compared with less complexity. The transformations implemented on the circuit design are provided to the verification module, in effect, one at a time and presented using HDL representations that facilitate faster, more efficient comparisons.

Figure 5:
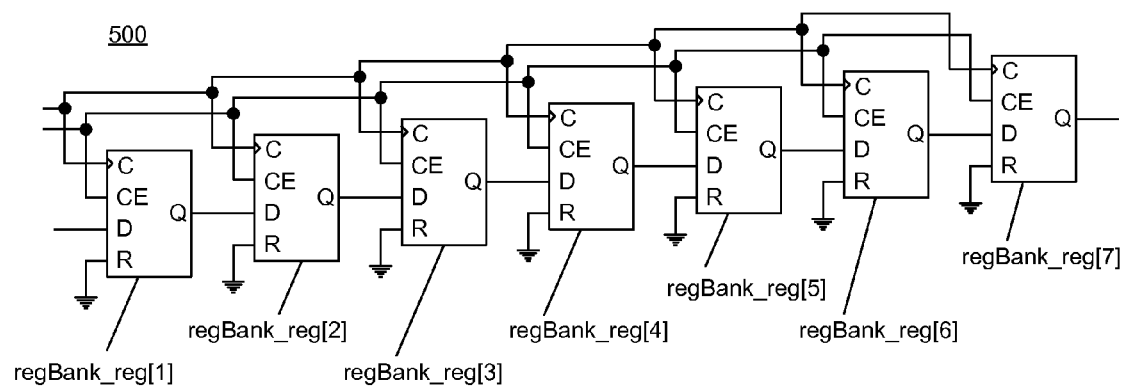
FIG. 5 is a block diagram illustrating an exemplary register-transfer level (RTL) implementation of a circuit.

FIG. 5 is a block diagram illustrating an exemplary RTL implementation of a circuit 500. Circuit 500 is a shift register circuit that includes seven registers. As shown, the registers are named as follows: regBank_reg[1], regBank_reg[2], regBank_reg[3], regBank_reg[4], regBank_reg[5], regBank_reg[6], and regBank_reg[7]. Circuit 500 represents a transformation input to a transformation such one that performs technology mapping.

Figure 6:
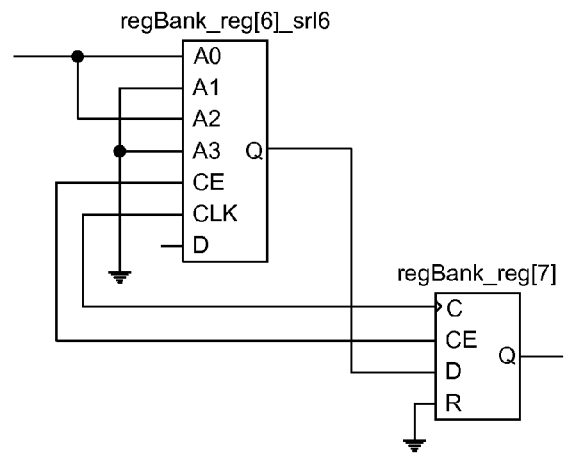
FIG. 6 is a block diagram illustrating an example of a technology mapped version of the circuit of FIG. 5.

FIG. 6 is a block diagram illustrating an example of a technology mapped version of circuit 500. FIG. 6 illustrates an example of a transformation output for a transformation of a synthesis flow that performs technology mapping. Further, FIG. 6 illustrates how mapping data can be included within the transformation output itself.

Within FIG. 6, a plurality of the registers of circuit 500 are implemented within a single, larger shift register circuit element called an "SRL" available on the target IC. The SRL circuit element is another example of a programmable circuit element that can be included or found on an IC having the architecture illustrated in FIG. 1. In this example, the SRL circuit element includes 32 registers that can drive themselves. In the example of FIG. 6, the SRL circuit element called "regBank_reg[6]_srl6" has subsumed registers regBank_reg[1], regBank_reg[2], regBank_reg[3], regBank_reg[4], regBank_reg[5], and regBank_reg[6] of circuit 500.

The technology mapping leaves the last register regBank_reg[7] in place connected to the output of regBank_reg[6]_srl6. Mapping data, in this example, is included within the transformation output as represented by FIG. 6 through the use of a particular naming convention. The SRL circuit element includes the formative "srl" in its name. Further, the number of registers used in the SRL circuit element is specified following "srl" as "6".

In this example, the SRL circuit element is named in a way that utilizes, or incorporates, the name of the registers subsumed within the SRL circuit within its name. Because the SRL circuit element implements registers regBank_reg[1], regBank_reg[2], regBank_reg[3], regBank_reg[4], regBank_reg[5], and regBank_reg[6] of circuit 500, the name of the SRL circuit element is generated by taking the last register in the chain of registers implemented by the SRL circuit element and appending a suffix. The suffix is an underscore (_) followed by a formative that is descriptive of the circuit element used. Thus, in this case, the suffix "_srl6" is appended to "regBank_reg[6]." If, for example, a DSP circuit block were used, the suffix could be "_dsp" or the like.

Accordingly, a verification process evaluating equivalency between FIG. 5 and FIG. 6 can determined, from the name "regBank_reg[6]_srl6" that the SRL circuit element, e.g., an output circuit element, includes regBank_reg[1], regBank_reg[2], regBank_reg[3], regBank_reg[4], regBank_reg[5], and regBank_reg[6], which are input circuit elements. The naming convention used further results in data compression as a separate file for storing mapping data is not required. While FIG. 6 appears to be a simplification of circuit 500 in that two blocks are replacing seven, the SRL circuit element includes 32 registers, which is a substantial increase in the number of registers from the RTL representation of circuit 500 of FIG. 5 to the technology mapped version illustrated in FIG. 6. The increase in the number of registers as illustrated in the transformation from FIG. 5 to FIG. 6 makes verification more difficult without the availability of suitable mapping data.

Figure 7:
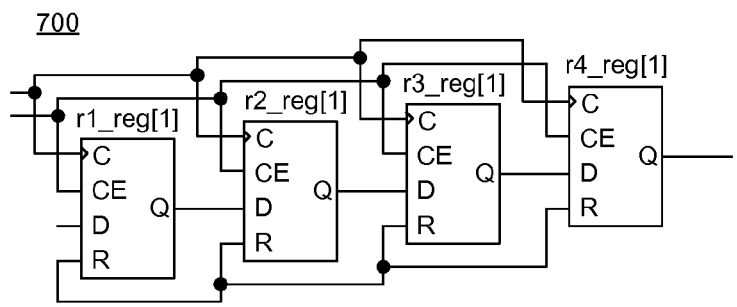
FIG. 7 is a block diagram illustrating an exemplary RTL implementation of a circuit.

FIG. 7 is a block diagram illustrating an exemplary RTL implementation of a circuit 700. Circuit 700 is a resettable shift register circuit. As shown, circuit 700 includes four registers named as follows: r1_reg[1], r2_reg[1], r3_reg[1], and r4_reg[1]. Circuit 700 represents a transformation input. Accordingly, r1_reg[1], r2_reg[1], r3_reg[1], and r4_reg[1] are input circuit elements.

Figure 8:
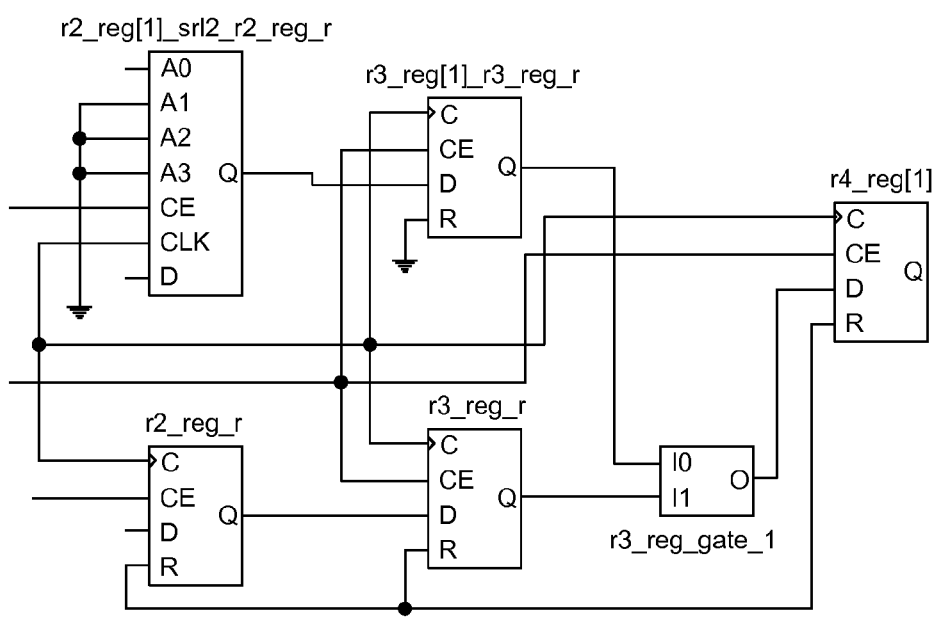
FIG. 8 is a block diagram illustrating an example of a technology mapped version of the circuit of FIG. 7.

FIG. 8 is a block diagram illustrating an example of a technology mapped version of circuit 700. FIG. 8 illustrates an example of a transformation output for a technology mapping transformation of a synthesis flow. Further, FIG. 8 illustrates how mapping data can be included within the transformation output itself.

Within FIG. 8, registers r1_reg[1] and r2_reg[1] are implemented within the SRL circuit element named "r2_reg[1]_srl2_r2_reg_r". The "r2_reg[1]" portion of the SRL circuit element name is taken from the last register of the chain of registers implemented within the SRL circuit element. The suffix "_srl2" is added indicating that the circuit element is an SRL circuit element and that the SRL circuit element includes, or implements, two registers from the prior circuit design representation, e.g., in this case FIG. 7.

For purposes of explanation, an SRL circuit element does not include a reset mechanism. As such, the transformation process builds additional circuitry to emulate or implement the reset behavior. In this example, the name of the additional register inserted by the transformation to implement the reset behavior of the SRL circuit element is appended to the name of the SRL circuit element. As shown, register r2_reg_r has been inserted by the technology mapping transformation. As such, the name "r2_reg_r" is appended to the SRL circuit element. Further, the name of the register r2_reg_r inserted into the circuit design is derived from the circuit element to which the register corresponds, e.g., r2_reg[1]_srl2_r2_reg_r.

Register r3_reg[1] is carried forward into FIG. 8 by the technology mapping transformation. Because an additional register is inserted, i.e., reg3_reg_r, to implement reset functionality for register r3_reg[1], the name of the inserted register is appended to r3_reg[1] resulting in a name of "r3_reg[1]_reg3_reg_r". Again, the name of the register inserted into FIG. 8, e.g., r3_reg_r, is derived from the register r3_reg[1]_r3_reg_r for which r3_reg_r provides reset functionality.

The technology mapping transformation further has inserted a LUT named r3_reg_gate_1. The LUT implements a single gate. As such, the suffix "_gate_1" is appended to "r3_reg", which indicates the particular register for which the LUT was added. Register r4_reg[1] is carried forward from circuit 700.

FIG. 9 is a block diagram illustrating an exemplary RTL implementation of a circuit 900. Circuit 900 is a RAM. Circuit 900 can be specified in HDL as a register declared as "reg [5:0] RAM [1023:0]". Circuit 900 represents a transformation input that can be provided to block 430 of FIG. 4.

FIG. 10 is a block diagram illustrating an example of a technology mapped version of circuit 900. FIG. 10 illustrates an example of a transformation output for a technology mapping transformation of a synthesis flow. Further, FIG. 10 illustrates how mapping data can be included within the transformation output itself. For example, FIG. 10 illustrates an exemplary transformation output from block 430 of FIG. 4.

When a register is mapped as part of a RAM, a suffix is added to the original register name to indicate the depth and offset of the distributed RAM instance. A first instance of the RAM is named "RAM_reg_512_575_3_5" and a second instance of the RAM is named "RAM_reg_576_639_3_5". In the name of each instance, the portion "RAM_reg" is taken from the original name of the register array from which each instance was derived. The portion "512_575" of the name of the first instance indicates that the first instance implements words from 512 to 575. The portion "576_639" of the name of the second instance indicates that the second instance implements words from 576 to 639. The "3_5" for each of first and second instances of the RAM indicate that each instance implements bits 3 to 5 of the register bus.

Referring to FIG. 4, transformation input (e.g., a data flow graph) provided as input to block 430 may include multiple names. For example, the RAM may be named "R" while the register is named "O" In the example pictured in FIGS. 9 and 10, the name of the vendor-specific cell is based upon the name of the RAM, e.g., "R." The name "O" for the register is dropped. This type of convention is understood by the verification process.

One or more additional naming conventions can be applied that are not illustrated in the figures. For example, as previously discussed, when a register is replicated, the suffix "_rep" can be appended (or prepended if so desired) to the original register name when creating the new, or replicated, copy of the register.

This specification relates to implementing a synthesis flow in a way that facilitates efficient formal verification. In accordance with the inventive arrangements disclosed within this specification, the synthesis flow performed on a circuit design is subdivided into a plurality of different transformations. Each transformation of the synthesis flow is configured to receive an input and generate an output that is provided to the next transformation of the synthesis flow. A formal verification process is performed on a per-transformation basis. As such, the input to each transformation is compared with the output of the transformation for purposes of formal verification.

As discussed, to facilitate verification, the input to each transformation is translated into an HDL representation as is the output from the transformation. Accordingly, the HDL representation of the input and the HDL representation of the output of each transformation are compared to prove equivalency between the two, e.g., between what is provided to the transformation as input and what is generated by the transformation as output.

The inventive arrangements disclosed within this specification provide various advantages over conventional verification that simply compares the input to a synthesis flow as a whole with the output from the synthesis flow. By breaking the formal verification process into a plurality of smaller formal verification processes, the plurality of smaller verification processes can be performed collectively with greater speed than conventional verification. In particular, the total number of verification processes described herein, as performed on a per-transformation basis, can be completed in less time than a conventional verification process that attempts to compare the input to the synthesis flow with the output of the synthesis flow. Further, verification performed on a per-transformation basis can be performed with greater certainty of completion than conventional verification, which is not guaranteed to prove equivalency.

Determining equivalency on a per-transformation basis advantageously reduces the amount of change introduced into the circuit design that must be accounted for by each verification process. Since the input to a transformation is compared to the output of the transformation, the amount of change introduced into the circuit design by the transformation is small compared to the change introduced by the synthesis flow as a whole. Reducing the amount of change in the circuit design representations being compared helps to ensure that each comparison, or verification process, is greatly simplified.

Another advantage over conventional verification is that because multiple comparisons are performed, a determination can be made as to where within the synthesis flow an error may have occurred. For instance, the particular transformation for which the output is determined not to be equivalent to the input can be determined unlike in conventional verification, which either passes or fails as a whole. Further, the synthesis flow can be discontinued when an error condition is determined to have occurred and a user notification issued.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects disclosed within this specification can be realized in hardware or a combination of hardware and software. One or more aspects can be realized in a centralized fashion in one system or in a distributed fashion where different elements are spread across several interconnected systems. Any kind of data processing system or other apparatus adapted for carrying out at least a portion of the methods described herein is suited.

One or more aspects further can be embedded in a computer program product, which includes all the features enabling the implementation of the methods described herein. The computer program product includes a data storage medium which is a non-transitory computer-usable or computer-readable medium, storing program code that, when loaded and executed in a system including a processor, causes the system to initiate and/or perform at least a portion of the functions and/or operations described within this specification. Examples of data storage media can include, but are not limited to, optical media, magnetic media, magneto-optical media, computer memory such as random access memory, a bulk storage device, e.g., hard disk, or the like.

Accordingly, the flowchart and block diagrams in the Figures illustrate the architecture, functionality, and operation of possible implementations of systems, methods and computer program products according to various aspects of the inventive arrangements disclosed herein. In this regard, each block in the flowchart or block diagrams may represent a module, segment, or portion of code, which includes one or more executable instructions for implementing the specified logical function(s). It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terms "computer program," "software," "application," "computer-usable program code," "program code," "executable code," variants and/or combinations thereof, in the present context, mean any expression, in any language, code or notation, of a set of instructions intended to cause a data processing system to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

Thus, throughout this specification, statements utilizing terms such as "processing" or "computing" or "calculating" or "determining" or "displaying" or "generating" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

The features disclosed within this specification can be embodied in other forms without departing from the spirit or essential attributes thereof. Accordingly, reference should be made to the following claims, rather than to the foregoing specification, as indicating the scope of such features and implementations.

What is claimed is:

1. A method of processing a circuit design, comprising:
generating, using a processor, a transformation output from a transformation input for each of a plurality of transformations of a synthesis flow applied to the circuit design;
wherein, for each transformation, the transformation input and the transformation output represent the circuit design and at least one circuit element is changed from the transformation input to the transformation output;
for each transformation, generating a hardware description language representation of the transformation input and a hardware description language representation of the transformation output; and
for each transformation, determining whether the hardware description language representation of the transformation input is equivalent to the hardware description language representation of the transformation output.

2. The method of claim 1, further comprising:
responsive to determining that the hardware description language representation of the transformation input is not equivalent to the hardware description language representation of the transformation output for a selected transformation of the plurality of transformations, generating a notification specifying a verification failure for the selected transformation.

3. The method of claim 1, further comprising:
for each transformation, including mapping information within the transformation output, wherein the mapping information correlates each circuit element of the transformation output to a circuit element of the transformation input.

4. The method of claim 3, further comprising:
specifying the mapping information as part of a naming convention used for each circuit element of the transformation output.

5. The method of claim 4, wherein a selected circuit element in a technology mapped transformation output is named according to a last of a plurality of circuit elements of the transformation input implemented by the selected circuit element.

6. The method of claim 1, wherein for a first of the plurality of transformations, the transformation output is specified as a data flow graph representation of the circuit design.

7. The method of claim 6, wherein for a second of the plurality of transformations, the transformation output is specified as a gate level netlist representation of the circuit design.

8. A system, comprising:
a processor coupled to a memory storing program code, wherein the processor, upon executing the program code, is programmed to initiate executable operations comprising:
generating a transformation output from a transformation input for each of a plurality of transformations of a synthesis flow applied to the circuit design;
wherein, for each transformation, the transformation input and the transformation output represent the circuit design and at least one circuit element is changed from the transformation input to the transformation output;
for each transformation, generating a hardware description language representation of the transformation input and a hardware description language representation of the transformation output; and
for each transformation, determining whether the hardware description language representation of the transformation input is equivalent to the hardware description language representation of the transformation output.

9. The system of claim 8, wherein the processor is further programmed to initiate an executable operation comprising:
responsive to determining that the hardware description language representation of the transformation input is not equivalent to the hardware description language representation of the transformation output for a selected transformation of the plurality of transformations, generating a notification specifying a verification failure for the selected transformation.

10. The system of claim 8, wherein the processor is further programmed to initiate an executable operation comprising:
for each transformation, including mapping information correlating each circuit element of the transformation output to a circuit element of the transformation input.

11. The system of claim 10, wherein the processor is further programmed to initiate an executable operation comprising:
specifying the mapping information as part of a naming convention used for each circuit element of the transformation output.

12. The system of claim 11, wherein a selected circuit element in a technology mapped transformation output is named according to a last of a plurality of circuit elements of the transformation input implemented by the selected circuit element.

13. The system of claim 8, wherein for a first of the plurality of transformations, the transformation output is specified as a data flow graph representation of the circuit design.

14. The system of claim 13, wherein for a second of the plurality of transformations, the transformation output is specified as a gate level netlist representation of the circuit design.

15. A non-transitory computer-readable medium having instructions which, when executed by a processor, perform a method comprising:
generating a transformation output from a transformation input for each of a plurality of transformations of a synthesis flow applied to the circuit design;
wherein, for each transformation, the transformation input and the transformation output represent the circuit design and at least one circuit element is changed from the transformation input to the transformation output;
for each transformation, generating a hardware description language representation of the transformation input and a hardware description language representation of the transformation output; and
for each transformation, determining whether the hardware description language representation of the transformation input is equivalent to the hardware description language representation of the transformation output.

16. The computer-readable medium of claim 15, further comprising:
responsive to determining that the hardware description language representation of the transformation input is not equivalent to the hardware description language representation of the transformation output for a selected transformation of the plurality of transformations, generating a notification specifying a verification failure for the selected transformation.

17. The computer-readable medium of claim 15, further comprising:
for each transformation, including mapping information correlating each circuit element of the transformation output to a circuit element of the transformation input.

18. The computer-readable medium of claim 17, further comprising:
specifying the mapping information as part of a naming convention used for each circuit element of the transformation output.

19. The computer-readable medium of claim 18, wherein a selected circuit element in a technology mapped transformation output is named according to a last of a plurality of circuit elements of the transformation input implemented by the selected circuit element.

20. The computer-readable medium of claim 15, wherein for a first of the plurality of transformations, the transformation output is specified as a data flow graph representation of the circuit design; and
wherein for a second of the plurality of transformations, the transformation output is specified as a gate level netlist representation of the circuit design.

* * * * *